Feb. 7, 1967 R. KRAUSZ 3,303,358
TRANSISTOR LOCKED FREQUENCY DIVIDER CIRCUIT
Filed March 12, 1964
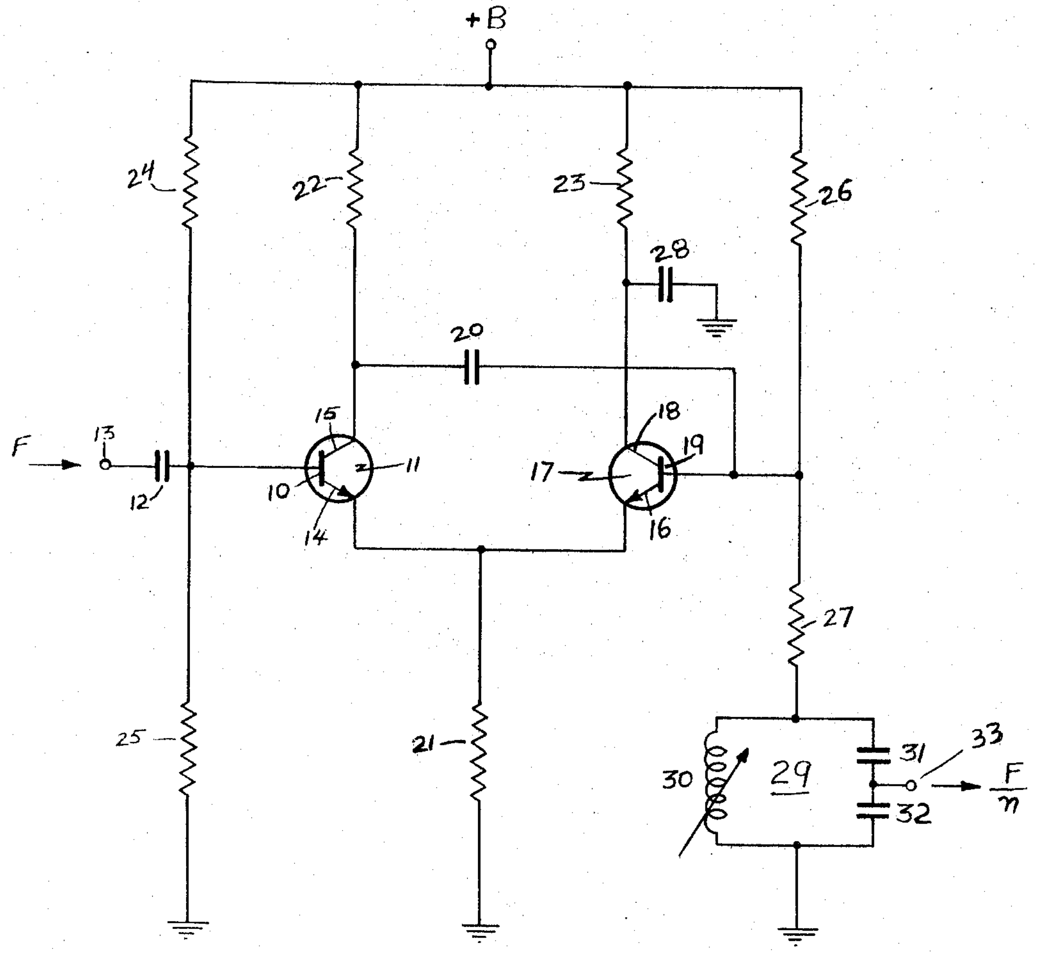
INVENTOR.
ROBERT KRAUSZ
BY Ernest J. Wemberger
Max R. Farmer
ATTORNEYS 3,303,358
Patented Feb. 7, 1967

3,303,358

TRANSISTOR LOCKED FREQUENCY DIVIDER CIRCUIT

Robert Krausz, Stamford, Conn., assignor, by mesne assignments, to the United States of America as represented by the Secretary of the Navy Filed Mar. 12, 1964, Ser. No. 351,572
1 Claim. (Cl. 307—88.5)

The present invention relates to locked-oscillator frequency divider circuits and more particularly to a transistorized locked frequency divider circuit.

The usual vacuum tube frequency divider consists essentially of a multivibrator, or relaxation, oscillator which is normally so unstable as to be readily made to oscillate in step or with a subharmonic of the input signal frequency which is to be divided. These presently available circuits are, however, rather large, require periodic maintenance and are relatively inefficient.

In accordance, therefore, it is an object of this invention to provide a simple, inexpensive, accurate transistorized locked-frequency divider wherein an input fundamental frequency may be applied to the divider and a constant submultiple frequency in synchronism therewith derived at the output.

Another object is to provide an improved transistor frequency divider circuit wherein high frequency division ratios may be achieved with a minimum of circuit elements and within a single stage.

Still another object is to provide a transistor divider circuit arrangement which is portable, lightweight, employs only low voltages and is capable of extended maintenance-free operation.

Other objects and advantages will appear from the following description of an example of the invention, and the novel features will be particularly pointed out in the appended claim.

In the single accompanying figure, which is a schematic diagram of an embodiment made in accordance with the principle of the instant invention, an input signal of frequency F is injected at the base electrode 10 of the first transistor 11 through input capacitor 12. Analysis has disclosed that where a frequency F is applied as an input to an oscillator tuned to a subharmonic of F as for example, $F/n$, synchronization may occur due to the cross-modulation between the input voltage and the harmonics of the oscillator frequency. Under these conditions one to one locking can be attained for any nonlinear oscillator and therefore it appears that by improving or increasing the harmonic content, the synchronizing or locking ability of the oscillator may be substantially improved. Clearly this could be accomplished through the use of vacuum circuitry but, where under the circumstances it is necessary to employ transistors, numerous difficulties, which have not been solved, must be overcome. Included in these, although not limited thereto, is the necessity in employing resistors to properly bias the transistor electrodes. Taken alone, this probably does not create any substantial difficulty but when considering the fact that this additionally affects the tuned circuitry, the two would appear to be almost mutually exclusive. This difficulty for one, has been overcome as will become evident in the ensuing description of my invention.

An input signal F, which may have, for example, a frequency of 1 megacycle per second, is supplied to an input terminal 13. The input signal is applied to the base electrode 10 of a transistor 11 through a coupling capacitor 12. The transistor 11 is preferably an NPN type silicon transistor although, of course, any suitable transistor known in the art may be utilized therefor.

The transistor 11 as is standard has additionally an emitter electrode 14, a collector electrode 15.

The emitter electrode 14 is directly connected to the emitter electrode 16 of a transistor 17. The transistor 17 is also preferably an NPN type silicon transistor, as is the transistor 11, although, of course similarly any suitable transistor known in the art may be utilized as the transistor 17, which is provided with the transistor, a collector electrode 18 and a base electrode 19.

The transistors are provided with additional circuitry so as to form a multivibrator. Capacitor 20 couples the output or collector 15 of the first transistor to the base 19 of the second transistor while emitter bias resistor 21 is connected from the emitters to ground. A B+ supply, not shown, supplies the collector potential by way of collector bias resistors 22 and 23. Base bias is provided by a pair of divider circuits comprising resistors 24, 25, and 26, 27, from the B+ supply. The frequency of the multivibrator is determined by resistors 21, 26, 27, 22 and capacitor 20. Collector electrode 15 and the base electrode 19 are coupled to each other through the capacitor 20 which thus acts as a coupling capacitor also. The common emitter connection is connected to a point at ground potential through an emitter bias resistor 21 so as to be included in the frequency determining circuit. The positive supply voltage B+, of for example 24 volts, can be used for the arrangement. Reiterating, a bias voltage for the transistors is derived from the supply voltage. The bias voltage is applied to a voltage divider comprising resistors 24 and 25, and the base voltage for the base electrode 10 is derived from this voltage divider. The positive supply voltage is applied to the collector electrode 15 through a resistor 22 and to the collector electrode 18 through a resistor 23. The bias voltage derived from the supply voltage is applied to a voltage divider comprising resistors 26 and 27, and the base voltage for the base electrode 19 is derived from this voltage divider. The collector electrode 18 is bypassed to a point at ground potential through a bypass capacitor 28. The base electrode 19 is coupled to a point at ground potential through a tuned filter or frequency selective means 29 and resistor 27. The tuned circuit 29 comprises, for example, a tuning variable inductance 30 and tuning capacitors 31 and 32, respectfully.

When the multivibrator is set to oscillate near or at some subharmonic of F (e.g. 1 mc.), as for example $F/n$ (100 kc.), the output signal, which will have a frequency of 100 kilocycles per second when the input signal frequency is 1 megacycle per second, is derived from an output terminal 33. A sine wave is produced at the resistor 27 if its value is very low as compared with the tuned circuit. As the resistance value of the resistor is increased, a sine wave continues to be produced thereat, but rapid transitions are obtained in the waveshape, indicating the presence and generation of high-order harmonics. With a moderate resistance value of the resistor 27, the tuned circuit 29 retains control of the oscillator frequency; the transistors functioning as an emitter-coupled oscillator. As the resistance value of the resistor 27 is increased, however, a critical point is reached at which relaxation oscillations are obtained.

With an intermediate resistance value of the resistor 27, excellent locking is obtained and stable frequency division by large integers may be achieved. At the same time, division by rational numbers is observed. The optimum resistance value of the resistor 27 for any desired condition is easily determined since it is a function of the frequency ratio, the impedance presented by the negative-resistance circuit, and the resonant impedance and Q of the tuned circuit 29. In any case the setting of the resistor 27 might in reality be considered a compromise; harmonic content sufficient for locking without excessive harmonic content which would decrease the frequency stability of the oscillator to such an extent that synchronization is lost.

The optimum tuned circuit Q is approximately equal to the frequency ratio utilized, when the circuit functions as a frequency divider. A lower value of Q will produce poor frequency stability which may cause a loss of synchronization, while a much higher Q will make adjustment difficult and will also result in a poor phase lock and restricted operating bandwidth.

In aligning the circuit, a small synchronizing voltage is preferably applied and the tuned circuit 29 is set for locking at the desired frequency ratio by means of a decade capacitor. The synchronizing voltage is then increased until the oscillator stops functioning. The optimum synchronizing voltage is approximately one-half this value. If an excessive amount of synchronization is applied, oscillation will cease at low collector supply voltage.

Clearly the designation of specific component values is readily possible but by selecting the resistor 27 in the manner described and employing the tuned circuit and voltage divider arrangement illustrated, this may be considerably easier. Listed below are the component values found to operate satisfactorily for a synchronizing frequency of 1 mc. and an output at 100 kc.

| | | |
|---|---|---|
| **11** and **17** | | 2N338 |
| **12** and **32** | mfd | 0.01 |
| **20** | mmfd | 500 |
| **21** | ohms | 220 |
| **22** | do | 1000 |
| **23** | do | 1500 |
| **24** and **26** | | 56K |
| **25** | | 10K |
| **27** | | 2.2K |
| **28** | mfd | 0.1 |
| **30** | microhenries | 400–800 |
| **31** | mmfd | 3000 |

It will be understood that various changes in the details, materials and arrangements of parts (and steps), which have been herein described and illustrated in order to explain the nature of the invention, may be made by those skilled in the art within the principle and scope of the invention as expressed in the appended claim.

I claim:

In a transistor frequency divider responsive to an input synchronizing signal of a particular frequency for generating an output signal of a subharmonic frequency thereof and having a dual transistor, emitter coupled multivibrator wherein the output thereof is derived across a resistor disposed between the base of one transistor and ground, that improvement which comprises:

(a) a filter having an inductance in parallel with a pair of capacitors and said output derived across one of said capacitors, said filter being interposed between said resistor and said ground, (b) said filter including means to tune to said subharmonic of said particular frequency and having a Q approximately equal to the ratio of said particular and said subharmonic frequency.

References Cited by the Examiner

UNITED STATES PATENTS

| | | | |
|---|---|---|---|
| 2,269,417 | 1/1942 | Crosby | 331—144 X |
| 2,419,772 | 4/1947 | Cottier | 331—144 |
| 2,553,165 | 5/1951 | Bliss | 331—144 |
| 2,772,359 | 11/1956 | Modiand | 331—113 X |

ARTHUR GAUSS, *Primary Examiner.*

J. HEYMAN, *Assistant Examiner.*